(12) United States Patent
Dür

(10) Patent No.: US 12,733,449 B2
(45) Date of Patent: Sep. 8, 2026

(54) PIN LIFTING DEVICE

(71) Applicant: VAT Holding AG, Haag (CH)

(72) Inventor: Michael Dür, Hohenweiler (AT)

(73) Assignee: VAT Holding AG, Haag (CH)

( * ) Notice: Subject to any disclaimer, the term of this patent is extended or adjusted under 35 U.S.C. 154(b) by 367 days.

(21) Appl. No.: 18/019,525

(22) PCT Filed: Jul. 16, 2021

(86) PCT No.: PCT/EP2021/069934
§ 371 (c)(1),
(2) Date: Feb. 3, 2023

(87) PCT Pub. No.: WO2022/028853
PCT Pub. Date: Feb. 10, 2022

(65) Prior Publication Data

US 2023/0290668 A1 Sep. 14, 2023

(30) Foreign Application Priority Data

Aug. 6, 2020 (DE) ......................... 102020120732.8

(51) Int. Cl.
*H10P 72/76* (2026.01)
*B23Q 1/44* (2006.01)

(52) U.S. Cl.
CPC ............ *H10P 72/7612* (2026.01); *B23Q 1/44* (2013.01)

(58) Field of Classification Search
CPC ............. H01L 21/68742; H01L 21/687; H01L 21/6833
See application file for complete search history.

(56) References Cited

U.S. PATENT DOCUMENTS 5,230,741 A * 7/1993 van de Ven ............. C23C 16/04 118/728
6,227,786 B1 5/2001 Tateyama
7,783,377 B2 * 8/2010 Harris ............... H01L 21/67748 700/121
11,512,393 B2 * 11/2022 Hiester ............. H01J 37/32623
11,532,492 B2 * 12/2022 Morikawa ......... H01L 21/67742
2004/0037676 A1 * 2/2004 Harris ............... H01L 21/67748 414/217

(Continued)

FOREIGN PATENT DOCUMENTS

DE 102018009871 6/2020
EP 3450809 3/2019

(Continued)

*Primary Examiner* — Lee D Wilson
(74) *Attorney, Agent, or Firm* — Volpe Koenig

(57) ABSTRACT

A pin lifting device (1) for lowering a substrate (2) onto a substrate carrier (15) and for lifting the substrate (2) off the substrate carrier (15) in a process chamber, in particular a vacuum process chamber. The pin lifting device (1) includes at least one lifting pin holder (4) and at least one lifting drive (5) for moving the lifting pin holder (4), which has a lifting pin (6) mounted thereon, in a reciprocating manner along a linear lifting motion path (7). The lifting pin holder (4) is mounted on the lifting drive (5) by a compensation bearing (8), and the compensation bearing (8) facilitates a relative movement between the lifting drive (5) and the lifting pin holder (4) in at least one direction (9) orthogonal to the linear lifting motion path (7).

18 Claims, 5 Drawing Sheets

(56) References Cited

U.S. PATENT DOCUMENTS

| | | | |
|---|---|---|---|
| 2006/0016398 A1 | 1/2006 | Dubost et al. | |
| 2018/0114716 A1 | 4/2018 | Hao et al. | |
| 2018/0130677 A1* | 5/2018 | Wakiyama | H01L 21/68785 |
| 2018/0158716 A1* | 6/2018 | Konkola | H01L 21/68742 |
| 2019/0355606 A1* | 11/2019 | Flotgen | H01L 21/6838 |
| 2020/0173018 A1* | 6/2020 | Hiester | H01L 21/68742 |
| 2020/0312678 A1* | 10/2020 | Morikawa | H01L 21/687 |
| 2023/0088715 A1* | 3/2023 | Hiester | H01L 21/68785 118/728 |
| 2023/0290668 A1* | 9/2023 | Dür | H01L 21/68742 |

FOREIGN PATENT DOCUMENTS

| | | | |
|---|---|---|---|
| JP | H10308348 | A | 11/1998 |
| JP | H11204430 | | 7/1999 |
| JP | 2006313766 | A | 11/2006 |
| JP | 2007036070 | A | 2/2007 |
| JP | 2008500709 | A | 1/2008 |
| JP | 2017195303 | A | 10/2017 |
| KR | 20070032960 | A | 3/2007 |
| KR | 100843107 | B1 | 7/2008 |
| KR | 1020090005878 | A | 1/2009 |

* cited by examiner

C
C
6
9
9
1
14
5
13
7
6
9
9
8
19
1
18
22
12
14
4
23
21
5
13

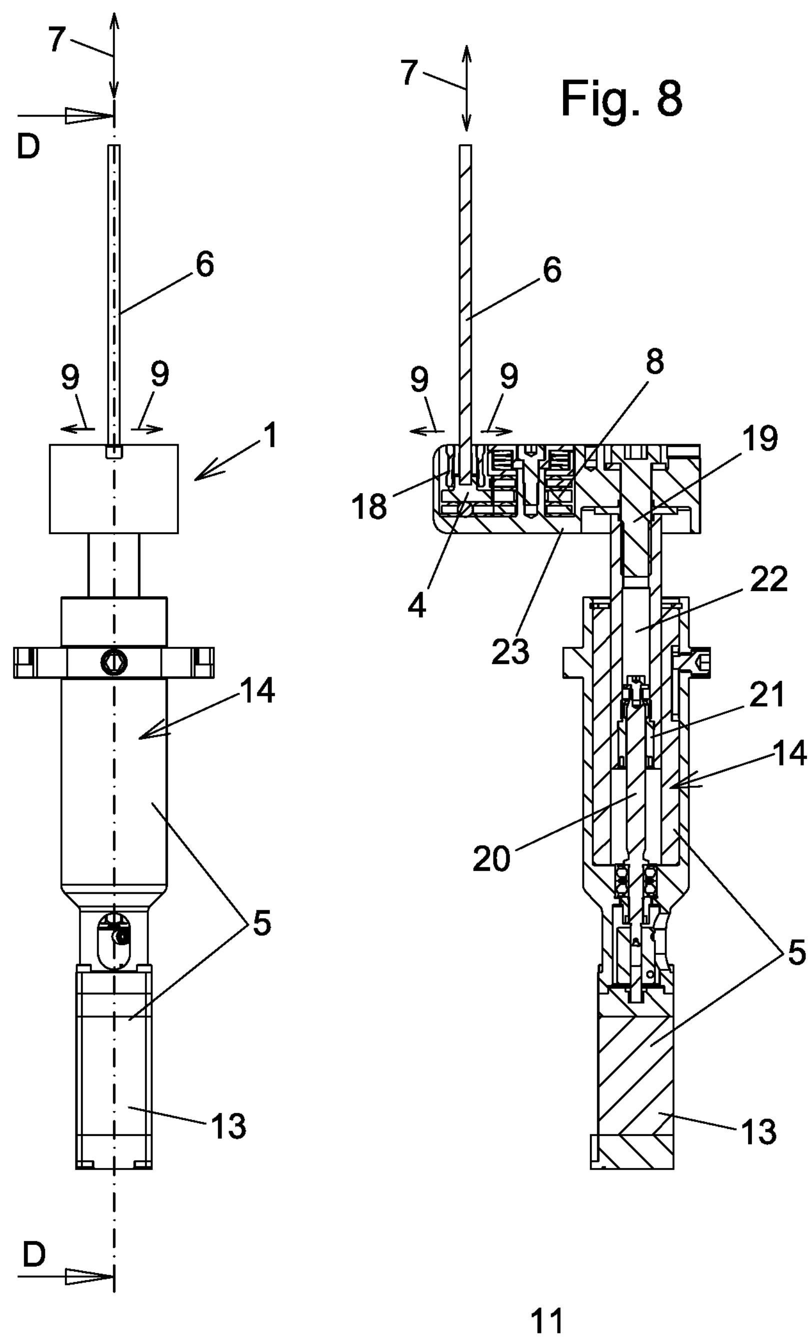
Fig. 7
7
D
6
9
9
1
14
5
13
D
Fig. 8
7
6
9
9
8
19
18
4
23
22
21
14
20
5
13
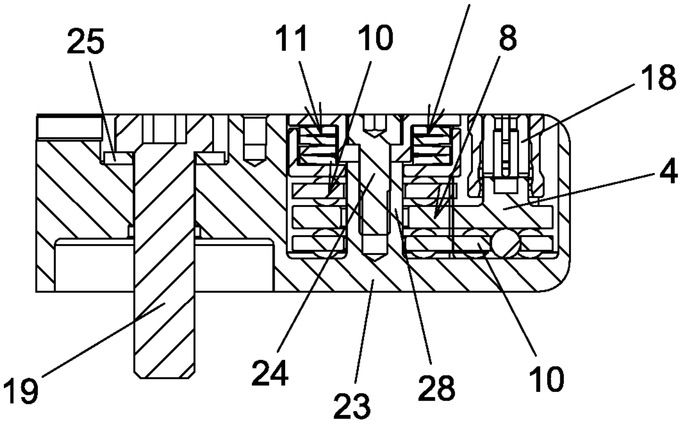
Fig. 9
25
11
10
11
8
18
4
19
24
23
28
10

PIN LIFTING DEVICE

CROSS-REFERENCE TO RELATED APPLICATIONS

This application is a 371 National Phase pf International Application No. PCT/EP2021/069934, filed Jul. 16, 2021, which claims the benefit of German Patent Application NO. 10 2020 120 732.8, filed Aug. 6, 2020, both of which are incorporated herein by reference as if fully set forth.

TECHNICAL FIELD

The present invention relates to a pin lifting device for lowering a substrate onto a substrate carrier and for lifting the substrate off the substrate carrier in a process chamber, in particular a vacuum process chamber, wherein the pin lifting device has at least one lifting pin holder and at least one lifting drive for moving in a reciprocating manner the lifting pin holder having a lifting pin disposed thereon along a linear lifting motion path.

BACKGROUND

Substrates such as wafers and the like in the prior art are often coated, mounted and/or otherwise processed in process chambers, in particular in vacuum process chambers. To this end, the substrates are mounted on substrate carriers during processing. The introduction of the substrates into the process chamber and also the retrieval of the substrates from the process chamber in most instances by means of suitable robotic arms and the like takes place through a corresponding chamber opening in the process chamber. It is also known here for the robotic arms to deposit the substrates on lifting pins of generic pin lifting devices in the process chamber. The substrates are then lowered onto the substrate carrier, or deposited on the latter, respectively, by means of the pin lifting device. After the processing steps have been carried out, the substrate is then also lifted off the pin lifting devices by means of the respective lifting pins again so as to subsequently be able to be retrieved from the process chamber again by means of the robotic arm or the like.

Generic pin lifting devices are known, for example, from DE 10 2018 009 871 A1, and also from EP 3 450 809 A1.

DE 10 2018 009 871 A1 is focused on the issue of how the monitoring of the operational readiness and of the wear and tear of the pin lifting device can be improved. To this end, DE 10 2018 009 871 A1 proposes the use of various sensors.

EP 3 450 809 A1 is focused on the issue of how the lifting pins, being wear parts, can be fitted so as to be interchangeable in an ideally simple manner on the lifting pin holder. To this end, EP 3 450 809 A1 proposes a special type of lifting pin coupling.

In the prior art it is known for the lifting pins driven by the pin lifting device to be mounted and to be guided in feedthroughs of the substrate carrier. The opening diameters of the feedthroughs through the substrate carriers here are very precisely adapted to the lifting pins. This in turn has the consequence that the pin lifting devices have to be very precisely adjusted during assembly, which leads to a correspondingly increased effort during assembly and repair works.

SUMMARY

It is an object of the invention to propose an improvement so that the effort when assembling the pin lifting devices can be reduced.

In order for this object to be achieved, the invention proposes a pin lifting device having one or more of the features described herein.

It is thus provided according to the invention that the lifting pin holder is mounted by means of a compensation bearing on the lifting drive, wherein the compensation bearing enables a relative movement between the lifting drive and the lifting pin holder in at least one direction orthogonal to the linear lifting motion path.

Made possible by means of the compensation bearing according to the invention between the lifting pin holder and the lifting drive is a relative movement between the lifting pin holder and the lifting drive in at least one direction orthogonal to the linear lifting motion path by way of which tolerance ranges which simplify the assembling and also the servicing of the pin lifting device are achieved. In other words, the same precision of work is no longer necessary when assembling the respective pin lifting device because any potential offset present between the feedthrough in the substrate carrier and the lifting pin holder is automatically equalized in a simple manner by way of the compensation bearing. Moreover, the tolerance ranges achieved by the compensation bearing according to the invention also enable, for example, the compensation of temperature-related geometric variations in the pin lifting device and/or in the substrate carrier and/or in the process chamber during the operation of the process chamber.

It is particularly preferably provided here that the compensation bearing enables a relative movement between the lifting drive and the lifting pin holder in a plane in relation to which the linear lifting motion path is normally disposed. This means that the potential for the relative movement between the lifting drive and the lifting pin holder provided by the compensation bearing is possible not only in individual directions orthogonal to the linear lifting motion path but, in the plane mentioned, is possible in all directions orthogonal to the linear lifting motion path. This may thus also be referred to as the potential for a relative movement between the lifting drive and the lifting pin holder on all sides in this plane.

In principle, it is possible for the lifting pin to be fixedly fastened in the lifting pin holder, as a result of which the lifting pin is then part of the pin lifting device. Typically however, it is favorable for the lifting pin to be provided as the interchangeable wear part. In this case, the lifting pin is not mandatorily part of the pin lifting device. Rather, it is provided that the lifting pin in this instance can be interchangeably disposed on the lifting pin holder, or fastened to the latter, respectively. To this end, corresponding lifting pin couplings are known in the prior art, for example from EP 3 450 809 A1 already mentioned at the outset. These lifting pin couplings can be used when implementing the invention so as to releasably and/or interchangeably fasten the lifting pin to the lifting pin holder.

Pin lifting devices according to the invention may also be referred to as pin lifters or else as ring lifters. The substrates to be processed in the process chamber are often also referred to as wafers in the prior art. The substrates may also be referred to as carriers, carrier members, carrier plates, layer carriers or the like. The processing procedures to be carried out on the respective substrate in the process chamber can be the most varied processing procedures. Conceivably, these may be, for example, mounting specific components on the substrate, coating the substrate, etching the substrate, etc. The substrate carrier of the process chamber can also be referred to as a chuck, as in the prior art.

The lifting drive of the pin lifting device may include different types of linear drives. For example, pneumatic or else hydraulic piston/cylinder units are conceivable. Other linear drives can also be used as the lifting drive. It is particularly favorable for the lifting drive to have an electric motor and a spindle drive driven by the electric motor for generating the reciprocating movement of the lifting pin holder and the lifting pin disposed thereon along the linear lifting motion path.

It is typically expedient for the pressures applied by the pin lifting device by way of the lifting pin on the substrate, the positioning of the lifting pin and/or the velocity of the movement when lowering and lifting the substrate to be monitored and preferably to be feedback-controlled. To this end, a sensor system, for example such as is known from the prior art mentioned at the outset, can be used in principle. When electric motors are used in the lifting drive, simple monitoring of the forces exerted by the pin lifting device by way of the lifting pin on the substrate can be achieved in that the current consumption of the electric motor of the lifting drive is monitored and optionally correspondingly feedback-controlled, or controlled, respectively. This is known per se in the prior art and does not need to be explained in more detail here.

In any case, it is favorable for the relative movement between the lifting drive and the lifting pin holder enabled by means of the compensation bearing to be configured so as to be low-friction and smooth-running. To this end, preferred variants of the invention propose that the compensation bearing has at least one bearing having rolling members or at least one friction bearing on which the lifting pin holder is mounted so as to be displaceable relative to the lifting drive in the at least one direction orthogonal to the linear lifting motion path, preferably in the plane in relation to which the linear lifting motion path is normally disposed. In this context, it is particularly favorable for the compensation bearing to have at least two bearings having rolling members and/or friction bearings, and for the lifting pin holder to be mounted between the bearings having rolling members and/or friction bearings. So-called ball cages having balls are particularly preferably used as bearings having rolling members. These are known per se. These are cages, or carrier plates, respectively, in which a plurality of balls are rotatably disposed. Such ball cages having balls have the advantage that they are very low-friction and smooth-running, on the one hand. On the other hand, they permit a relative movement between the lifting drive and the lifting pin holder that is uniform and associated with the same low friction in all directions orthogonal to the lifting motion path.

The compensation of tolerances enabled by the compensation bearing is favorably in a range between 0 mm and 6 mm, preferably between 0 mm and 3 mm. It is thus preferably provided that the compensation bearing enables a relative movement between the lifting pin holder and the lifting drive in the at least one direction orthogonal to the linear lifting motion path at an interval of 0 mm to 6 mm, preferably of 0 mm to 3 mm, or that the compensation bearing enables a relative movement between the lifting pin holder and the lifting drive in the plane in relation to which the linear lifting motion path is normally disposed at an interval of 0 mm to 6 mm, preferably of 0 mm to 3 mm.

In order for the compensation bearing to be designed ideally without play in a direction parallel to the lifting motion path, preferred variants of the invention provide that the pin lifting device has a pre-tensioning device for elastically pre-tensioning the lifting pin holder in the compensation bearing in a direction coaxial with or parallel to the lifting motion path.

It is preferably also provided that the lifting drive has a lifting drive movement axis, and the lifting drive movement axis is disposed so as to be offset parallel to the lifting pin disposed in the lifting pin holder. Deviating therefrom however, in pin lifting devices according to the invention, it can also be provided that the lifting drive movement axis and the lifting pin disposed in the lifting pin holder are disposed so as to be mutually coaxial.

Pin lifting devices according to the invention can be provided or used in the most varied types of process chambers. However, said pin lifting devices according to the invention are particularly preferably used in so-called vacuum process chambers. Vacuum process chambers are considered to be those in which processes take place, or conditions are adjusted, respectively, in which operating states with pressures of less than or equal to 0.001 mbar (millibar), or 0.1 Pascal, respectively, are achieved. In more general terms, vacuum process chambers can also be considered to be in general negative-pressure process chambers if the latter are conceived for pressures below the normal pressure, thus below 1 bar.

BRIEF DESCRIPTION OF THE DRAWINGS

Further features and details of preferred design embodiments of the invention will be explained hereunder by way of example in the form of variants of embodiment according to the invention. In the figures:

FIG. 7 shows a lateral view of the pin lifting device according to FIGS. 5 and 6, but in the deployed position;

FIG. 8 shows the longitudinal section along the section line D-D from FIG. 7;

FIG. 9 shows an enlarged illustration of the part of the pin lifting device of this first exemplary embodiment that is relevant to the invention;

FIG. 12 shows a second exemplary embodiment according to the invention of a pin lifting device in a lateral view;

FIG. 13 shows a longitudinal section through the variant according to FIG. 12; and FIG. 14 shows the region F from FIG. 13 in an enlarged illustration.

DETAILED DESCRIPTION

Figure 1:
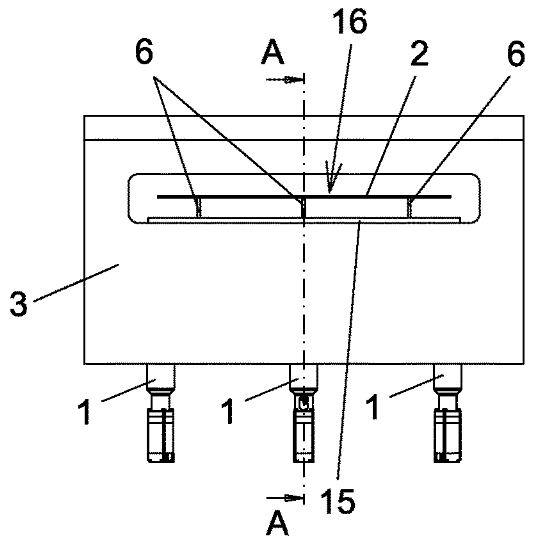
FIG. 1 shows a schematic external view of a vacuum process chamber having pin lifting devices according to the invention.
Figure 3:
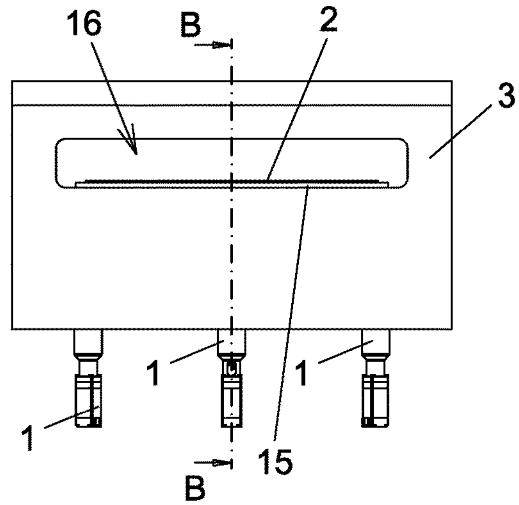
FIG. 3 again shows an external view of the vacuum process chamber according to FIG. 1.

A process chamber 3 is schematically illustrated from the outside in FIGS. 1 and 3, wherein it is in each case possible to see through the chamber opening 16 and therein see the substrate 2 mounted on the lifting pins 6 of the pin lifting devices 1. In the operating position according to FIG. 1, the substrate 2 by means of the lifting pins 6 of the pin lifting device 1 is lifted off the substrate carrier 15. Said substrate 2 here bears on the lifting pins 6. In the operating position according to FIG. 3, the lifting pins 6 of the pin lifting device are retracted so far along the lifting motion path 7 that the substrate 2 lies on the substrate carrier 15, as is provided for processing the substrate 2 in the process chamber 3.

Figure 2:
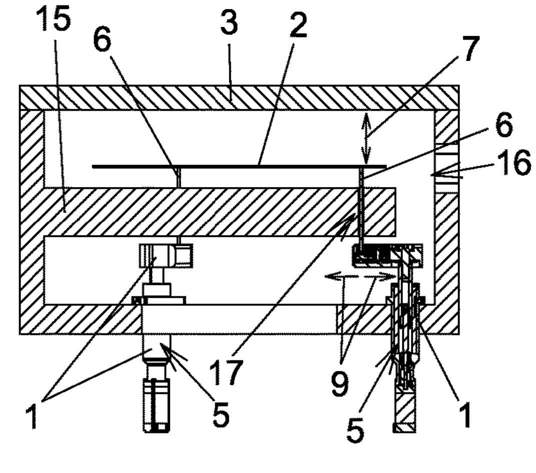
FIG. 2 shows a longitudinal section along the section line A-A.
Figure 4:
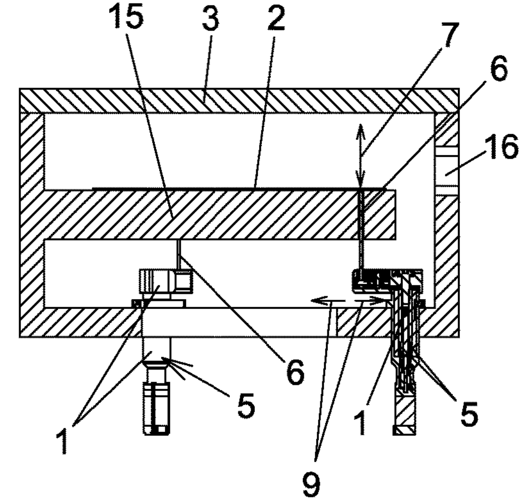
FIG. 4 shows the longitudinal section along the section line B-B from FIG. 3.

FIG. 2 shows the longitudinal section along the section line A-A from FIG. 1, and FIG. 4 shows the longitudinal section along the section line B-B from FIG. 3. Various additional components of such process chambers 3, as are known in the prior art, are not illustrated here for the sake of simplification, since they are not relevant to the invention. These may include, for example, pump systems for evacuating the process chamber 3. The valve for closing the chamber opening 16 is also not illustrated. Incorporating and retrieving the substrates 2 into the process chamber 3 and from the process chamber 3 through the chamber opening 16 can take place as is known per se in the prior art and also schematically shown in FIG. 1 in DE 10 2018 009 871 A1. The robotic arm not illustrated here, in the deployed position according to FIGS. 1 and 2, can deposit the substrate 2 on the lifting pins 6 and retrieve said substrate 2 from the latter. Lowering the substrate 2 onto the substrate carrier 15, as well as lifting the substrate 2 off the substrate carrier 15, takes place by means of the pin lifting device 1 according to the invention and the lifting pins 6 which are disposed in the respective lifting pin holders 4 of the pin lifting devices 1. As can be seen in FIGS. 2 and 4, the lifting pins 6 here are mounted so as to be displaceable through feedthroughs 17 in the substrate carriers 15. The feedthroughs 17, which may also be referred to as feedthrough openings, are typically adapted to the thickness of the lifting pins 6 to a very exact fit such that comparatively tight tolerances have to be taken into account when assembling the pin lifting devices 1 in the prior art, this being associated with a corresponding assembly effort.

Figures 5, 6:
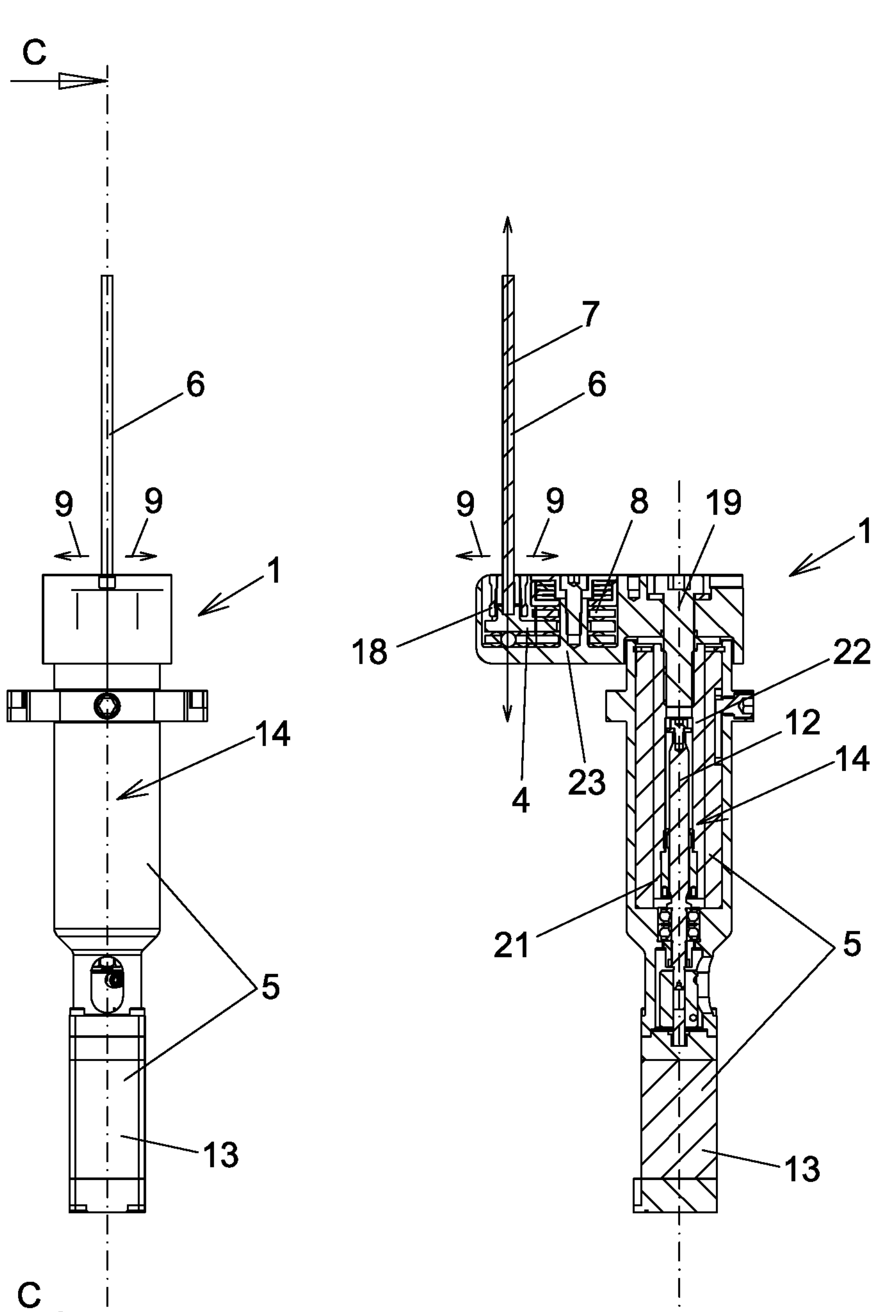
FIG. 5 shows a first exemplary embodiment of a pin lifting device according to the invention in a lateral view, in a retracted position.
FIG. 6 shows the longitudinal section along the section line C-C from FIG. 5 through this pin lifting device.

In order to eliminate this disadvantage of the prior art, pin lifting devices 1 according to the invention have at least one compensation bearing 8 by means of which the lifting pin holder 4 is mounted on the lifting drive 5, wherein the compensation bearing 8 enables a relative movement between the lifting drive 5 and the lifting pin holder 4 in at least one of the directions 9 orthogonal to the linear lifting motion path 7. The pin lifting devices 1 according to the invention, which are used in this first exemplary embodiment, are illustrated in FIGS. 5 to 8, wherein FIGS. 5 and 6 show the operating position in which the lifting pin holder 4 having the lifting pin 6 disposed thereon is retracted to the position in which the substrate 2 lies on the substrate carrier 15. FIGS. 7 and 8 show the correspondingly deployed position along the lifting motion path 7, in which the lifting pins 6 lift the substrate 2 off the substrate carrier 15, as is illustrated in FIGS. 1 and 2.

FIG. 6 shows the longitudinal section through the pin lifting device 1 according to the invention of the first exemplary embodiment according to the section line C-C from FIG. 5. FIG. 8 shows a corresponding longitudinal section along the section line D-D from FIG. 7.

As has already been mentioned at the outset, for the lifting drive 5 which is used in pin lifting devices 1 according to the invention there are various variants for implementing the linear movement along the lifting motion path 7 by means of the lifting drive 5. In the exemplary embodiment shown, the lifting drive 5 has an electric motor 13 and a spindle drive 14. The electric motor 13 rotates the spindle 20 of the spindle drive 14 about the longitudinal axis of said spindle 20 which is disposed so as to be coaxial with the lifting drive movement axis 12. In a manner known per se, the spindle 20 by way of the external thread thereof engages in the internal thread of a spindle nut 21 of the spindle drive 14. The spindle nut 21 in turn is fixed to the lifting drive rod 22 of the spindle drive 14 such that the rotation of the spindle 20 by means of the electric motor 13 in the respective rotating direction results in a retraction or deployment of the lifting drive rod 22 and thus in corresponding movements of the lifting pin 6 along the linear lifting motion path 7, said lifting pin 6 being disposed in the lifting pin holder 4.

The compensation bearing 8, which is relevant to the invention, in this exemplary embodiment is accommodated in the bearing housing 23. The bearing housing 23 is fastened to the lifting drive rod 22 and thus to the lifting drive 5 by way of the fastening screw 19. The lifting pin holder 4, by means of the compensation bearing 8, is mounted so as to be movable relative to the bearing housing 23 and thus also relative to the lifting drive 5 in the directions 9 orthogonal to the lifting motion path 7. For a more detailed explanation pertaining to how this is configured in this first exemplary embodiment, reference is made to FIGS. 9 and 10.

Figure 10:
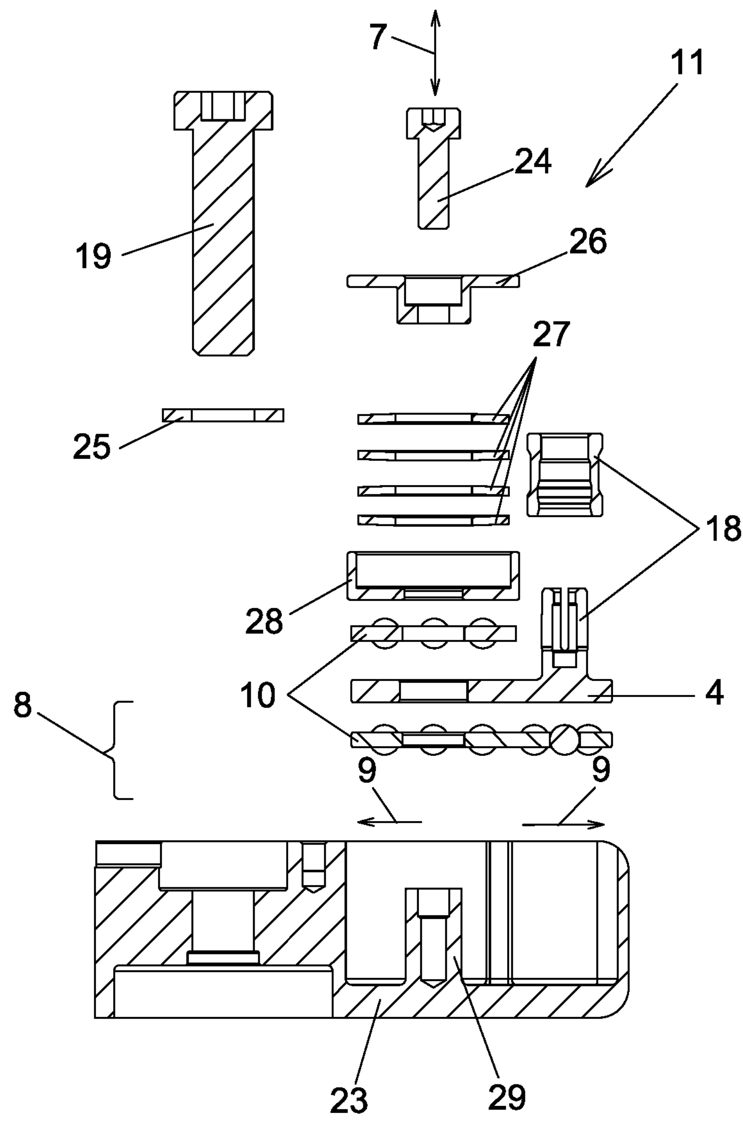
FIG. 10 shows the components illustrated in FIG. 9 in an exploded illustration.

FIG. 9 shows the bearing housing 23 and the components of the pin lifting device 1 disposed therein in the assembled state. FIG. 10 shows these components in an exploded illustration.

In the first exemplary embodiment, the compensation bearing 8 has two bearings 10 having rolling members in the form of ball cages having balls. The lifting pin holder 4 is located between these two bearings 10 having rolling members. The bearings 10 having rolling members ensure that the lifting pin holder 4 can be moved relative to the lifting drive 5 almost without friction, or at least with only very little friction, respectively, in the directions 9 orthogonal to the lifting motion path 7. A receptacle for the lifting pin 6 is located on the lifting pin holder 4. In this exemplary embodiment, this receptacle is configured as a lifting pin coupling 18 which is known per se. The lifting pin 6 in this lifting pin coupling 18 can be interchangeably fastened to the lifting pin holder 4. The lifting pin coupling 18 can be embodied as in EP 3 450 809 A1, for example. Of course, other design embodiments of this lifting pin coupling 18 are also conceivable. If the lifting pin 6 does not have to be considered as a wear part, said lifting pin 6 can even be fixedly fastened to the lifting pin holder 4.

Instead of the bearings 10 having rolling members, embodied in the form of ball cages having balls, other bearings 10 having rolling members or else friction bearings can also be used, wherein however corresponding ball cages having balls, or bearings 10 having rolling members, respectively, ensure particularly low friction values.

In order for the lifting pin holder 4 and the bearings 10 having rolling members, or the entire compensation bearing 8, respectively, to be pre-tensioned without play in the direction parallel to the lifting motion path 7, a pre-tensioning device 11 is provided in this exemplary embodiment. The latter has the pre-tensioning screw 24, the pre-tensioning collar 26, the pre-tensioning cup 28 and the spring collars 27 disposed between the pre-tensioning collar 26 and the pre-tensioning cup 28. The pre-tension which is exerted by the pre-tensioning device 11 on the compensation bearing 8 can be adjusted by means of the pre-tensioning screw 24 which is screwed into a corresponding screw receptacle 29 in the bearing housing 23.

The fastening screw 19 already mentioned, and the washer 25 disposed between this fastening screw 19 and the bearing housing 23, are likewise illustrated in FIGS. 9 and 10. Also plotted are the directions 9 orthogonal to the lifting motion path 7, in which the compensation bearing 8 according to the invention permits a relative movement between the lifting pin holder 4 and the lifting drive 5.

Figure 11:
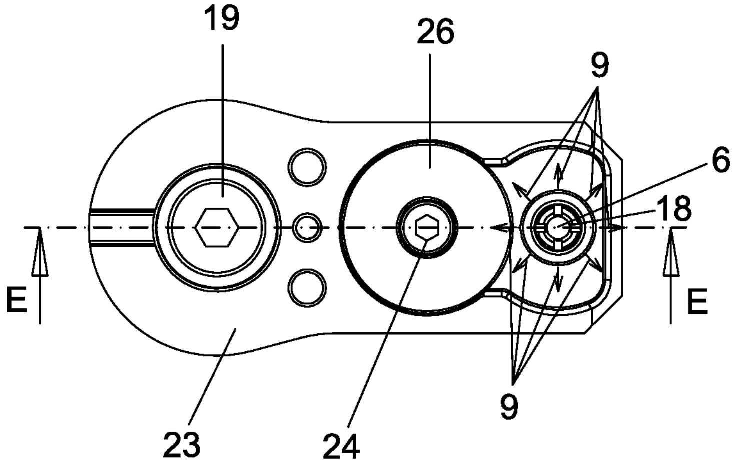
FIG. 11 shows a plan view onto the part of the pin lifting device of the first exemplary embodiment illustrated in FIG. 9.

In preferred design embodiments like the one shown here, this movement potential which is made available by the compensation bearing 8 is not only the potential of a movement in individual directions 9 normal to the lifting motion path 7, but the potential of the relative movement between the lifting pin holder 4 and the lifting drive 5, or the bearing housing 23, respectively, on all sides in a plane on which the lifting motion path 7 is normal. This is visualized by the various directions 9 which are used by way of example and are illustrated in FIG. 11 and lie in said plane. The section line E-E shown in FIG. 11 visualizes the section plane along which the illustrations 9 and 10 are sectioned.

In the first exemplary embodiment of the pin lifting device 1 according to FIGS. 1 to 11, the lifting drive movement axis 12 of the lifting drive 5 is disposed so as to be offset parallel to the lifting pin 6 disposed in the lifting pin holder 4. This is not mandatory as will yet be visualized by means of the second exemplary embodiment of a pin lifting device 1 according to the invention in accordance with FIGS. 12 to 14, which is discussed hereunder. This second exemplary embodiment of a pin lifting device 1 according to the invention can be used in the same manner in process chambers 3 as is shown by means of FIGS. 1 to 4 for the first exemplary embodiment according to the invention of the pin lifting device 1.

In this second exemplary embodiment, the lifting pin 6, or the lifting motion path 7, respectively, are disposed so as to be coaxial with the lifting drive movement axis 12. The lifting drive 5, as well as the lifting pin coupling 18, are configured substantially as in the first exemplary embodiment such that further explanations to this end can be dispensed with.

Figures 12, 13, 14:
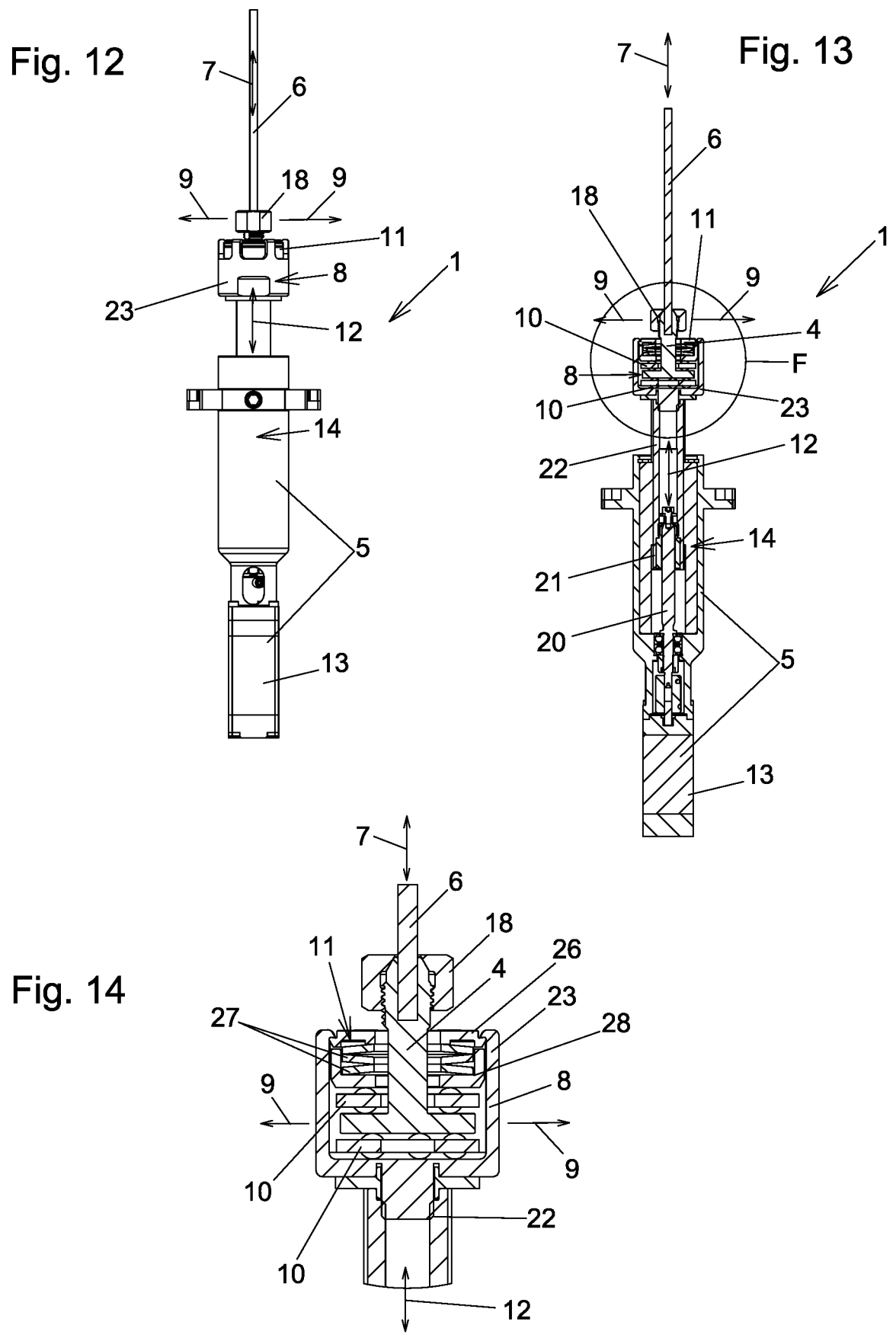

FIG. 14 shows the sub-region F of the sectional illustration from FIG. 13 in an enlargement. Here too, a compensation bearing 18 in which the lifting pin holder 4 is mounted between two bearings 10 having rolling members, in the form of ball cages having balls, is provided. This compensation bearing 8 also ensures the potential of the relative movement of the lifting pin holder 4 in relation to the lifting drive 5 in directions 9 orthogonal to the lifting motion path 7. In the corresponding plane on which the lifting motion path 7 is normal is also a potential for equalizing tolerances on all sides. In this exemplary embodiment, the pre-tensioning is likewise ensured by a pre-tensioning device 11 which is again configured from a pre-tensioning collar 26 and a pre-tensioning cup 28 and spring collars 27 disposed therebetween. This pre-tensioning device 11 also ensures corresponding elastic pre-tensioning of the compensation bearing 8 in the direction parallel to the lifting motion path 7 and thus a corresponding position without play in this direction.

LIST OF REFERENCE SIGNS

1 Pin lifting device
2 Substrate
3 Process chamber
4 Lifting pin holder
5 Lifting drive
6 Lifting pin
7 Lifting motion path
8 Compensation bearing
9 Direction
10 Bearing with rolling members
11 Pre-tensioning device
12 Lifting drive movement axis
13 Electric motor
14 Spindle drive
15 Substrate carrier
16 Chamber opening
17 Feedthrough
18 Lifting pin coupling
19 Fastening screw
20 Spindle
21 Spindle nut
22 Lifting drive rod
23 Bearing housing
24 Pre-tensioning screw
25 Washer
26 Pre-tensioning collar
27 Spring collar
28 Pre-tensioning cup
29 Screw receptacle

The invention claimed is:

1. A pin lifting device for lowering a substrate onto a substrate carrier and for lifting the substrate off the substrate carrier in a process chamber, the pin lifting device comprising:
- at least one lifting pin holder;
- at least one lifting drive configured to move the lifting pin holder and a lifting pin disposed thereon back and forth along a linear lifting motion path;
- a compensation bearing by which the lifting pin holder is mounted on the lifting drive, the compensation bearing enables a relative movement between the lifting drive and the lifting pin holder in at least one direction orthogonal to the linear lifting motion path; and
- a pre-tensioning device configured to elastically pre-tension the lifting pin holder in the compensation bearing in a direction coaxial with or parallel to the lifting motion path.

2. The pin lifting device as claimed in claim 1, wherein the compensation bearing enables a relative movement between the lifting drive and the lifting pin holder in a plane in relation to which the linear lifting motion path is normally disposed.

3. The pin lifting device as claimed in claim 1, wherein the compensation bearing has at least one bearing having rolling members, or at least one friction bearing, on which the lifting pin holder is mounted so as to be displaceable relative to the lifting drive in the at least one direction orthogonal to the linear lifting motion path.

4. The pin lifting device as claimed in claim 3, wherein the compensation bearing comprises at least two bearings having at least one of the rolling members or the friction bearings, and the lifting pin holder is mounted between the bearings.

5. The pin lifting device as claimed in claim 3, wherein the bearing having rolling members includes a ball cage having balls.

6. The pin lifting device as claimed in claim 1, wherein the compensation bearing enables a relative movement between the lifting pin holder and the lifting drive in the at least one direction orthogonal to the linear lifting motion path at an interval of 0 mm to 6 mm.

7. The pin lifting device as claimed in claim 2, wherein the compensation bearing enables a relative movement between the lifting pin holder and the lifting drive in the plane in relation to which the linear lifting motion path is normally disposed at an interval of 0 mm to 6 mm.

8. The pin lifting device as claimed in claim 1, wherein the lifting drive has a lifting drive movement axis, and the lifting drive movement axis is disposed so as to be offset parallel to the lifting pin disposed in the lifting pin holder.

9. The pin lifting device as claimed in claim 1, wherein the lifting drive has an electric motor and a spindle drive driven by the electric motor.

10. A pin lifting device for lowering a substrate onto a substrate carrier and for lifting the substrate off the substrate carrier in a process chamber, the pin lifting device comprising:

at least one lifting pin holder;

at least one lifting drive configured to move the lifting pin holder and a lifting pin disposed thereon back and forth along a linear lifting motion path;

a compensation bearing by which the lifting pin holder is mounted on the lifting drive, the compensation bearing enables a relative movement between the lifting drive and the lifting pin holder in at least one direction orthogonal to the linear lifting motion path; and a pre-tensioning device configured to elastically pre-tension the lifting pin holder in the compensation bearing in a direction coaxial with or parallel to the lifting motion path, the pre-tensioning device including a pre-tensioning collar and a pre-tensioning cup and spring collars disposed therebetween.

11. The pin lifting device as claimed in claim 10, wherein the compensation bearing enables a relative movement between the lifting drive and the lifting pin holder in a plane in relation to which the linear lifting motion path is normally disposed.

12. The pin lifting device as claimed in claim 10, wherein the compensation bearing has at least one bearing having rolling members, or at least one friction bearing, on which the lifting pin holder is mounted so as to be displaceable relative to the lifting drive in the at least one direction orthogonal to the linear lifting motion path.

13. The pin lifting device as claimed in claim 12, wherein the compensation bearing comprises at least two bearings having at least one of the rolling members or the friction bearings, and the lifting pin holder is mounted between the bearings.

14. The pin lifting device as claimed in claim 12, wherein the bearing having rolling members includes a ball cage having balls.

15. The pin lifting device as claimed in claim 10, wherein the compensation bearing enables a relative movement between the lifting pin holder and the lifting drive in the at least one direction orthogonal to the linear lifting motion path at an interval of 0 mm to 6 mm.

16. The pin lifting device as claimed in claim 11, wherein the compensation bearing enables a relative movement between the lifting pin holder and the lifting drive in the plane in relation to which the linear lifting motion path is normally disposed at an interval of 0 mm to 6 mm.

17. The pin lifting device as claimed in claim 10, wherein the lifting drive has a lifting drive movement axis, and the lifting drive movement axis is disposed so as to be offset parallel to the lifting pin disposed in the lifting pin holder.

18. The pin lifting device as claimed in claim 10, wherein the lifting drive has an electric motor and a spindle drive driven by the electric motor.

* * * * *